United States Patent [19]
Koeppe

[11] Patent Number: 4,799,096
[45] Date of Patent: Jan. 17, 1989

[54] MONOLITHIC INTEGRATED CIRCUIT COMPRISING CIRCUIT BRANCHES PARALLEL TO ONE ANOTHER

[75] Inventor: Siegmar Koeppe, Laatzen, Fed. Rep. of Germany

[73] Assignee: Siemens Aktiengesellschaft, Berlin and Munich, Fed. Rep. of Germany

[21] Appl. No.: 56,882

[22] Filed: Jun. 3, 1987

[30] Foreign Application Priority Data

Jun. 6, 1986 [DE] Fed. Rep. of Germany ....... 3619064

[51] Int. Cl.[4] .................. H01L 27/02; H01L 27/10; H01L 29/78
[52] U.S. Cl. ......................... 357/42; 357/45; 357/41; 357/23.14; 307/576
[58] Field of Search ............... 357/42, 45, 41, 23.14; 307/575, 576, 242

[56] References Cited

U.S. PATENT DOCUMENTS

| | | | |
|---|---|---|---|
| 3,967,988 | 7/1976 | Davidsohn | 357/23.11 |
| 4,555,721 | 11/1985 | Bansal et al. | 357/42 |
| 4,680,609 | 7/1987 | Calder et al. | 367/42 |

Primary Examiner—Andrew J. James
Assistant Examiner—Robert P. Limanek
Attorney, Agent, or Firm—Van Santen, Steadman & Simpson Hill

[57] ABSTRACT

Monolithically-integrated circuits comprise at least two circuit branches parallel to one another which respectively contain one or more field effect transistors. In order to reduce open errors in the transistor leads, the connecting regions of the field effect transistors are constructed such that they form strip-shaped connecting zones which are interrupted only by the channel regions of the field effect transistors and which are otherwise self-contained.

5 Claims, 3 Drawing Sheets

MONOLITHIC INTEGRATED CIRCUIT COMPRISING CIRCUIT BRANCHES PARALLEL TO ONE ANOTHER

BACKGROUND OF THE INVENTION

1. Field of the Invention

The present invention is directed to a monolithic integrated circuit comprising circuit branches which are parallel to one another and which lie between first and second circuit points, each of the branches containing one or more field effect transistors.

2. Description of the Prior Art

In circuit regions of the type generally set forth above with which, for example, gate functions of logic circuit technology are realized, there is the difficulty that an interruption error (open error) in one of the parallel circuit branches is difficult to identify by way of the standard methods for automatic error recognition. In particular, these methods are based on the fact that the inputs of the circuit to be checked are supplied with a sequence of test bit patterns, at least one of such bit patterns being of such a nature that it suitable for the recognition of a specific circuit error, i.e. leads to an output bit pattern at the circuit outputs which departs in terms of at least one bit from a reference bit pattern to be expected at the output when there are no errors.

If an open error is to be recognized in a defined parallel circuit branch, however, it is not adequate to supply a test bit pattern to the circuit input, this test bit pattern being individually assigned to this error. On the contrary, the circuit must be previously placed into a preparatory state by applying an initialization bit pattern, this preparatory state being likewise individually assigned to this error.

Since, when a test bit pattern deviating from the individually assigned test bit pattern is applied, the preparatory state can, in turn, be canceled, entire sequences each composed of an initialization bit pattern and of a test bit pattern appertaining thereto and following immediately thereupon must be applied to the circuit inputs in order to be able to investigate the parallel circuit branches individually for the presence of open errors.

The open errors in such circuits are essentially caused by the severing of interconnects at the edges of the field oxide layers, by deficient contactings between the terminal regions of the field effect transistors and the assigned connecting lines, and by the deposit of contaminating particles during circuit manufacture. These problems thereby appear to an increasing degree given progressive miniaturization of the circuit structures.

SUMMARY OF THE INVENTION

The object of the present invention is to provide a circuit of the type set forth above which can be checked with respect to open errors in the leads of the field effect transistors in a significantly more simple manner than was heretofore possible.

The above object is achieved, in a monolithic integrated circuit comprising at least two circuit branches which extend parallel to one another and lie between first and second circuit points and each of which contains one or more field effect transistors which is particularly characterized in that the connecting regions of the field effect transistors contained in two of these parallel circuit branches are interrupted only by the channel regions thereof, but otherwise form a self-contained, strip-shaped connecting zone.

The advantage which may be obtained in practicing the present invention is particularly comprised in that unnecessary sources of risks which can lead to an open error in the parallel circuit branches, which are particularly critical with respect to the testing, are largely avoided by the utilization of a self-contained, strip-shaped connecting zone which unites the terminal regions of the field effect transistors of at least two parallel circuit branches. The open errors occurring outside of the strip-shaped connecting zone can be located in a relatively simple manner by way of an automatic error recognition technique, so that the testability of such a circuit is improved to a rather considerable degree.

BRIEF DESCRIPTION OF THE DRAWINGS

Other objects, features and advantages of the invention, its organization, construction and operation, will be best understood from the following detailed description, taken in conjunction with the accompanying drawings, on which.

DESCRIPTION OF THE PREFERRED EMBODIMENTS

Figure 1:
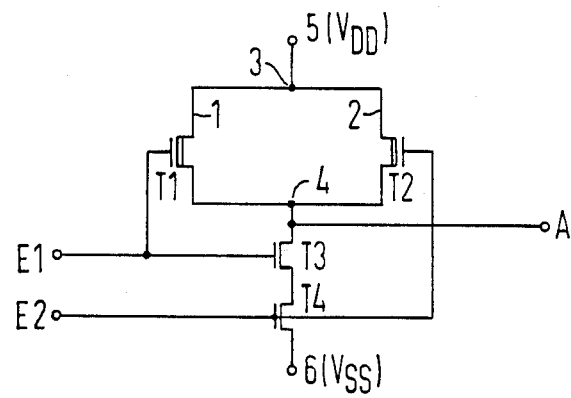
FIG. 1 is a schematic circuit diagram of a known NAND gate comprising two inputs.

The NAND gate constructed in complementary circuit technology and shown in FIG. 1 comprises two circuit branches 1 and 2 which extend parallel to one another, each of the circuit branches being connected to a first circuit point 3 and to a second circuit point 4. The circuit branch 1 contains the source-drain path of a p-channel field effect transistor T1 whose gate is connected to a first input E1. In a corresponding manner, the circuit branch 2 contains the source-drain path of a p-channel field effect transistor T2 whose gate is connected to a second input E2. The circuit point 3 is connected to a supply voltage $V_{DD}$ by way of a terminal 5. A further circuit branch contains the source-drain paths of 2n-channel field effect tansistors T3 and T4, connected in series with one another, and connects the circuit point 4 to a terminal 6 which is connected to a reference potential $V_{SS}$. The gate of the transistor T3 is connected to the input E1 and the gate of the transistor T4 is connected to an input E2. The circuit output A is connected to a further branch at the circuit point 4 above the transistor T3.

Figure 2:
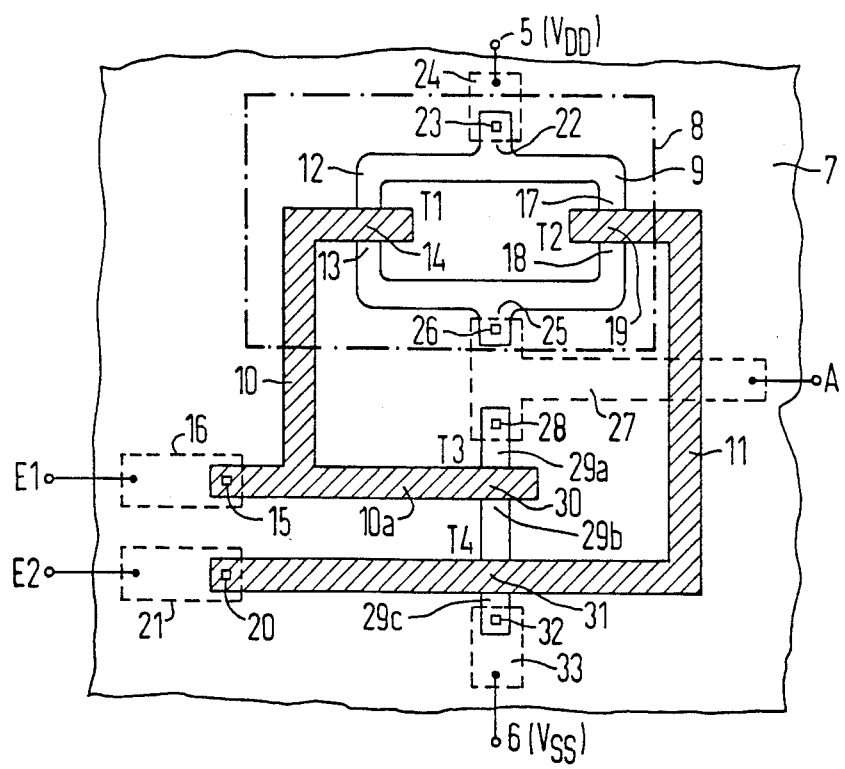
FIG. 2 is a plan view of a NAND gate comprising two inputs constructed in accordance with the present invention.

FIG. 2 illustrates, in a plan view, a monolithic integrated circuit constructed to realize the NAND function of FIG. 1 and which is fashioned in accordance with the present invention. A doped semiconductor body 7 of, for example, p-conductive silicon is provided with an n-conductive well 8 which extends up to the boundary surface of the semiconductor body 7 visible in FIG. 2 and is bounded, in the lateral direction, by a dot-dash line. A p-conductive, self-contained, strip-shaped connecting zone 9 is inserted into the well 8, the conductive zone 9 containing terminal regions, i.e. the respective source and drain regions, of the two transistors T1 and T2 as sub-zones. Two strips 10 and 11 of polycrystalline silicon, which are separated from the visible boundary surface of the semiconductor body 7 by an electrically-insulating layer (not shown in detail) represent the gate electrodes of the transistors T1 and T2 including the assigned connecting lines. In particular, sub-zones 12 and 13 of the connecting zone 9, which are immediately adjacent to the angled, horizontal portion of the strip 10 in FIG. 2, form the source and the drain regions of the transistor T1. An n-doped sub-region 14 of the well 8, which is covered by a portion of the strip 10, is present between the sub-zones 12 and 13, the sub-region 14 forming the channel region of the transistor T1. The portion of the strip 10 covering this area represents the gate. The strip 10 is contacted in a region of a contact hole 15 by a conductive coating 16 of, for example, aluminum. This is entered in broken lines and is connected to a terminal which corresponds to the input E1. In an analogous manner, the transistor T2 is composed of the sub-zone 17 and 18 of the strip 9, of the n-conductive channel region located therebetween, and of the portion of the strip 11 covering this area. The strip 11 is contacted in the region of a contact hole 20 by a conductive coating 21 of, for example, aluminum which is connected to a terminal corresponding to the input E2.

Apart from the n-conductive channel regions 14 and 19, the strip-shaped connecting zone 9 which contains the source drain regions of the transistors T1 and T2 is constructed as a self-contained zone. A first shoulder 22 of the zone 9 is contacted by a conductive coating 24 in the region of a contact hole 23, the terminal 5 of the coating 24 being connected to a supply voltage $V_{DD}$. A second shoulder 25 of the zone 9 is contacted in the region of a hole 26 by a conductive coating 27 which is provided with a terminal corresponding to the output A. The coating 27 contacts an n-conductive zone 29a in the region of a contact hole 28, the zone 29a being inserted into the semiconductor body 7 and extending up to a sub-region 30 of the semiconductor body 7 which is covered by a projection 10a of the strip 10. In an extension of the zone 29a, a further n-conductive zone 29b is inserted between the sub-region 30 and the sub-region 31 of the semiconductor body 7 covered by a portion of the strip 11. Finally, a third n-conductive zone 29c is inserted into the semiconductor body 7 below the strip 31, this third zone 29c being contacted by a conductive coating 33 within a contact hole 32. The coating 33 is provided with a terminal 6 connected to a reference potential, here ground potential, $V_{SS}$. The sub-region 30 of the semiconductor body 7 represents the channel region of the transistor T3. The portions 29a and 29b represent its drain and source regions. This projection 10a forms the gate electrode of the transistor T3, including the appertaining connecting line. The sub-region 31 of the semiconductor body 7 forms the channel region of the transistor T4. The portions 29b and 29c form the drain and source regions thereof. The strip 11 forms the gate electrode of the transistor T4, including the appertaining connecting line. The elements 25-33 form the circuit branch in FIG. 1 including the transistors T3 and T4.

The conductive coatings 16, 21, 24, 27 and 33 are composed, for example, of aluminum and are separated from the strips 10 and 11 of polycrystalline silicon by an electrically-insulating intermediate layer. The contact holes 15 and 20 are located in the insulating intermediate layer. The contact holes 23, 26, 28 and 32 are also located in the intermediate layer and in the electrically-insulating layer located therebelow.

Since open errors in the leads to the source and drain regions of the individual transistors within the self-contained, strip-shaped connecting zone 9 manufactured by diffusion or implantation are excluded with great reliability, errors of this type can now occur practically only in the circuit branches lying outside of the connecting zone 9, i.e. between the connecting zone 9 and the gate output A or between the connecting zone 9 and the terminal 5 or between the output A and the terminal 6. An open error present in these circuit regions, however, can be identified in a simple manner with the assistance of a method of automatic fault or error recognition, since it has the same influence on all transistors of the parallel branches 1 and 2 (FIG. 1).

Figure 3:
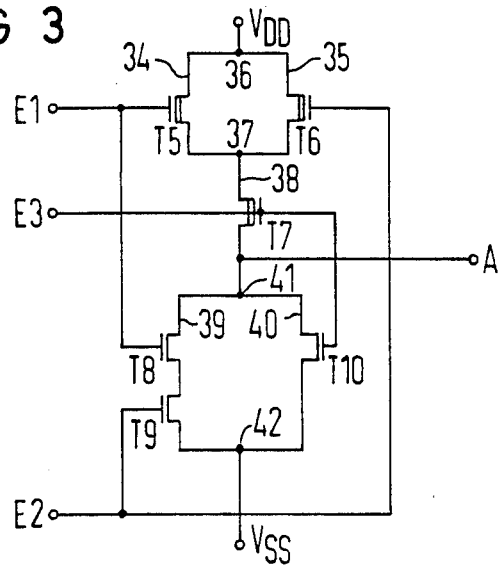
FIG. 3 is a schematic circuit diagram of a known AND/NOR gate comprising three inputs.

FIG. 3 illustrates an AND/NOR gate constructed in complementary circuit technology comprising three inputs E1–E3 and an output A. The inputs E1 and E2 are connected to the gates of two p-channel field effect transistors T5 and T6 whose source-drain paths respectively lie in circuit branches 34 and 35 which are parallel to one another and which connect to circuit points 36 and 37. The circuit point 36 is connected to a terminal that is connected with the supply voltage $V_{DD}$. A further circuit branch 38 is connected to the circuit point 37, the further circuit branch 38 containing the source-drain path of a p-channel field effect transistor T7. The gate of the transistor T7 is driven by way of the input E3. By way of the transistor T7, one arrives first of all, at the output A, and, secondly, at a sub-circuit composed of the parallel circuit branches 39 and 40 which are arranged between a circuit point 41 and circuit point 42. The circuit point 42 is connected to a terminal which is connected to the reference potential, here $V_{SS}$. The circuit branch 39 contains the source-drain paths of two n-channel transistors T8 and T9 connected in series with one another. The circuit branch 40 contains the source-drain path of an AND-channel transistor T10. The gate terminals of the transistors T8, T9 and T10 are connected to the inputs E1, E2 and E3.

Figure 4:
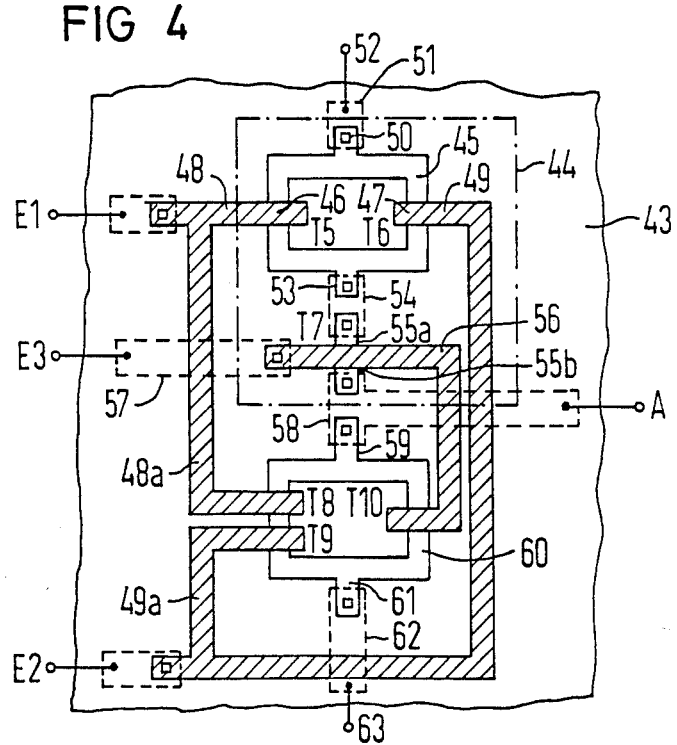
FIG. 4 is a plan view of an AND/NOR gate constructed in accordance with the present invention and being of the type of circuit illustrated in FIG. 3.

FIG. 4 illustrates a semiconductor circuit constructed in accordance with the present invention with which the gate function of the circuit of FIG. 3 is realized. Once again, a p-conductive semiconductor body 43 is provided into which an n-conductive, well-shaped zone 44 is inserted. The connecting regions of the field effect transistors T5 and T6, which are located in the parallel circuit branches 34 and 35, are combined into a p-conductive connecting zone 45 which is interrupted only by two n-conductive regions 46 and 47 under the strips 48 and 49 of polycrystalline material, but is otherwise self-contained. The regions 46 and 47 represent channel regions of the transistors T5 and T6. The strips 48 and 49, which are separated from the visible boundary surface of the semiconductor body 43 by an electrically-insulating layer, form the gates of these transistors with portions lying above the regions 46 and 47. They are connected to the inputs E1 and E2 in a manner set forth above with respect to FIG. 2, that is by way of metal, here aluminum, coatings or layers. The connecting zone 45 is connected to a terminal 52 by way of a projection 50 and by way of a conductive coating 51, as already set forth, the terminal 52 being connected to the supply voltage $V_{DD}$. A second projection 53 of the strip 45 is connected to a p-conductive zone 55a by way of a conductive coating 54 which contacts the projection 53, this p-conductive zone 55a being inserted into the n-conductive well 44 and extending up to the edge of a strip 56 of polycrystalline silicon which is separated from the visible boundary surface of the semiconductor body 43 by the electrically-insulating layer. A further p-conductive region 55b is inserted into the well 44 such that the sub-region of the well 44 lying between this region and the region 55a is covered by a portion of the strip 56 of polycrystalline silicon. The elements 55a, 55b and 6 form the connecting regions and the gate of the transistor T7. The strip 56 is thereby connected to the input E3 by way of a conductive coating 57.

One proceeds from the connecting region 55b via a conductive coating 58 to the gate output A and to the projection 59 of an n-conductive self-contained semiconductor zone 60 inserted into the semiconductor body 43, the zone 60 uniting the connecting regions of the transistors T8–T10 lying in the parallel circuit branches 39 and 40. The gate electrode of the transistor T8 is composed of a portion of a branching 48a of the strip 48. The gate of the transistor T9 is composed of a portion of a branch 49a of the strip 49. The gate of the transistor T10 is composed of a portion of an extension of a strip 56. A projection 61 of the connecting zone 60 is connected to a terminal 63 which lies at reference potential, being connected thereto by way of a conductive coating 62. As may be seen from FIG. 4, the connecting zone 60, differing from the connecting zone 45, not only contains the connecting regions of two field effect transistors which are arranged in parallel circuit branches 34 and 35, but also contains the connecting regions of the transistors T8, T9 and T10 of which the transistors T8 and T9 are connected in series with one another in the parallel circuit branch 39.

Since the open errors in the leads to the source regions and to the drain regions of the field effect transistors in the circuit of FIG. 4 are now practically limited to only the connection between the connecting zones 45 and 60 and to the connections of these connecting zones of the terminals 52, 63 and A and such errors have an identical influence on all transistors within the parallel circuit branches 34, 35, 39 and 40, a relatively simple fault or error recognition can be carried out by way of test bit patterns applied to the inputs.

Figure 5:
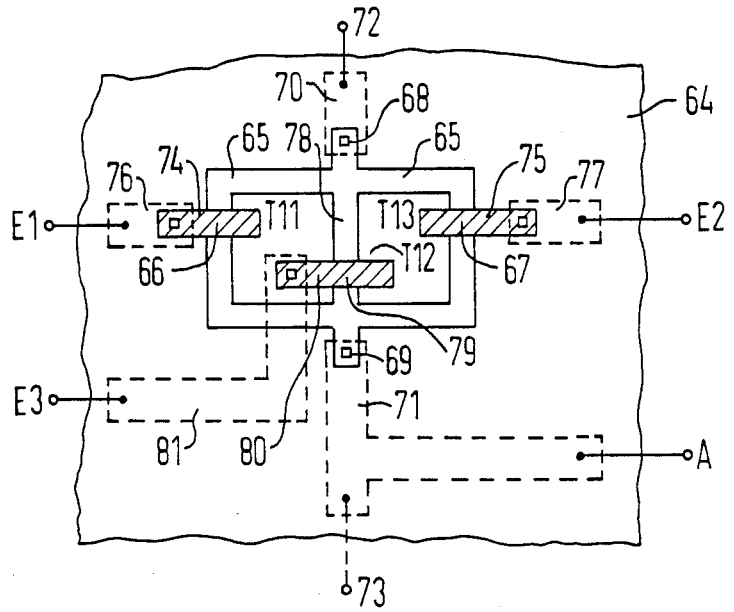
FIG. 5 is a plan view of a circuit arrangement constructed in accordance with the present invention, shown in plan view and comprising three parallel circuit branches.

FIG. 5 illustrates a portion of an integrated circuit constructed in accordance with the present invention in which three circuit branches, parallel to one another, are provided, each of these circuit branches containing a field effect transistor T11, T12 or, respectively, T13. Here, an n-conductive well 64 is inserted into a p-conductive semiconductor body and is provided with a p-conductive connecting zone 65 which contains the connecting regions of the transistors T11 and T13. Apart from the channel regions of the transistors T11 and T13, which are referenced 66 and 67 and are composed of sub-regions of the well 64, the connecting zone 65 is self-contained. The circuit points between which the two parallel circuit branches lie can be represented, for example, by the contactings in the regions of the contact hole 68 and 69 by way of which a connection to the conductive coatings 70 and 71 occurs. The coating 70 comprises a terminal 72 which is connected to the supply voltage, whereas the coating 71 is provided with a terminal A which corresponds to the circuit output. The coating 71, finally, is connected to a terminal 73 which is connected to a reference potential, being connected thereto by way of further circuit portions which are not shown in detail. The gates of the transistors T11 and T13 are formed of strips 74 and 75 of polycrystalline silicon which are connected to two circuit inputs E1 and E2 by way of conductive coatings 76 and 77.

A further parallel circuit branch, which likewise connects the two circuit points 68 and 69 to one another, and which is equipped with a field effect transistor T12, is realized by a p-conductive connecting zone 78 which connects two sub-zones of the connecting zone 65 lying in the region of the circuit points 68 and 69 to one another. This connecting zone is interrupted only by the channel region of the transistor T12 which is composed of a sub-region 79 of the well 64 which is covered by a strip of polycrystalline silicon. The portions of the connecting zone adjacent to the subregion 79 represent the source region and the drain region of the transistor T12. That portion of the strip 80 covering the sub-region 79 represents the gate. The strip 80 is connected to the input E3 of the circuit by way of a conductive coating 81.

Figure 6:
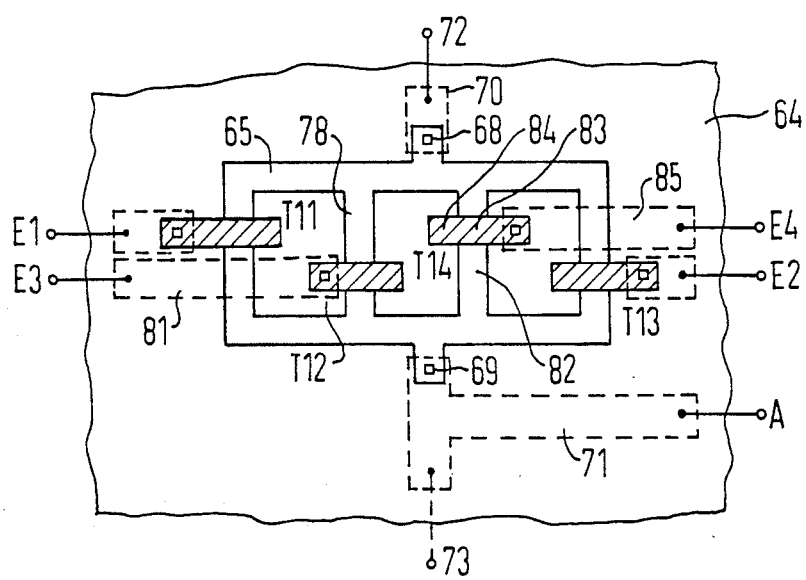
FIG. 6 is a plan view of a circuit arrangement constructed in accordance with the present invention and comprising four parallel circuit branches.

FIG. 6 differs from FIG. 5 only on the basis of a further p-conductive connecting zone 82 which connects two further sub-zones of the self-contained connecting zone 65 to one another. The connecting zone 82 is interrupted by an n-conductive sub-region 83 of the well 64 which is covered by a portion of a strip 84 of polycrystalline silicon. The portions of the connecting zone 82 adjacent to the sub-region 83 form the source region and the drain region of a transistor T14. The portion 84 covering the sub-region 83 forms the gate. The strip 84 is connected to a fourth input E4 of the circuit by way of a conductive coating 85.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A monolithic integrated circuit comprising:
    first and second circuit points;
    at least two circuit branches extending parallel to one another between and connected to said first and second circuit points and each comprising a field effect transistor including a source, a drain and a gate;
    each of said branches including self-contained, strip-shaped connecting zones each of which is interrupted only in the channel regions of said field effect transistors; and
    a further strip-shaped connecting zone connected between said first and second circuit points and including a further field effect transistor including a source, a drain and a gate, said further strip-shaped connecting zone interrupted only in the channel region of said further field effect transistor.

2. The monolithic integrated circuit of claim 1, wherein:

a further strip-shaped connecting zone is provided between said first and second circuit points and includes a further field effect transistor including a source, a drain and a gate, said further strip-shaped connecting zone interrupted only in the channel region of said further field effect transistor.

3. The monolithic integrated circuit of claim 1, constructed as a gate circuit, wherein:
a further circuit branch is provided, comprising at least one further field effect transistor, and is connected to said second circuit point.

4. The monolithic integrated circuit of claim 3, constructed as a CMOS circuit, and further comprising:
a semiconductor body carrying said further circuit branch, said semiconductor body being of a first conductivity type, and including a well-shaped zone in said semiconductor body of a second conductivity type opposite that of said first conductivity type, said parallel circuit branches lying in said well-shaped zone.

5. The monolithic integrated circuit of claim 3, constructed as a CMOS gate, and further comprising:
a semiconductor body of a first conductivity type having said parallel circuit branches arranged therein, and a well-shaped zone of a second conductivity type opposite to that of said first conductivity type having said further circuit branch lying therein.

* * * * *